(12) United States Patent
Ishikawa

(10) Patent No.: US 8,179,140 B2
(45) Date of Patent: May 15, 2012

(54) METHOD OF ESTIMATING SOLID PHASE POTENTIAL

(75) Inventor: Yosuke Ishikawa, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 509 days.

(21) Appl. No.: 12/500,654

(22) Filed: Jul. 10, 2009

(65) Prior Publication Data
US 2011/0006776 A1    Jan. 13, 2011

(51) Int. Cl.
*G01N 27/416* (2006.01)
(52) U.S. Cl. .................................. 324/432; 324/429
(58) Field of Classification Search .............. 324/432, 324/429
See application file for complete search history.

(56) References Cited

U.S. PATENT DOCUMENTS

| 5,808,445 | A | | 9/1998 | Aylor et al. |
|---|---|---|---|---|
| 5,888,665 | A | * | 3/1999 | Bugga et al. ............ 429/499 |
| 6,160,382 | A | | 12/2000 | Yoon et al. |
| 6,262,577 | B1 | | 7/2001 | Nakao et al. |
| 6,480,003 | B1 | | 11/2002 | Ugaji et al. |
| 6,646,419 | B1 | | 11/2003 | Ying |
| 7,317,299 | B2 | | 1/2008 | Koo |
| 7,352,156 | B2 | | 4/2008 | Ashizawa et al. |
| 2003/0184307 | A1 | | 10/2003 | Kozlowski et al. |
| 2004/0225451 | A1 | * | 11/2004 | Filikov ............................. 702/22 |
| 2007/0145948 | A1 | | 6/2007 | Lim et al. |
| 2008/0054850 | A1 | | 3/2008 | Tae et al. |
| 2008/0135316 | A1 | | 6/2008 | Koch et al. |
| 2008/0224709 | A1 | | 9/2008 | Tae et al. |
| 2009/0295337 | A1 | | 12/2009 | Ishikawa |
| 2010/0072955 | A1 | | 3/2010 | Ishikawa |

FOREIGN PATENT DOCUMENTS

EP    2048763 A1    4/2009

OTHER PUBLICATIONS

G. Ning; B.N. Popov, "Cycle Life Modeling of Lithium-Ion Batteries," Journal of Electrochemical Society, vol. 151 (2004), pp. A1584-A1591.
S. Santhanagopalan, R.E. White, "Online estimation of the state of charge of a lithium ion cell," Journal of Power Sources, vol. 161 (2006), pp. 1346-1355, Elsevier, B.V.

* cited by examiner

*Primary Examiner* — M'Baye Diao
(74) *Attorney, Agent, or Firm* — Capitol City TechLaw, PLLC; Mark E. Duell

(57) ABSTRACT

The present teachings are directed toward a machine implemented method for estimating the solid phase potentials of either positive or negative electrode of a battery. The machine implemented method includes providing battery voltage information and an estimated solid phase potential to a model coefficient updater to update a model coefficient. Battery current information is provided to a battery internal variable estimator along with the updated model coefficient so that the solid phase potentials can be determined. A multi-layer model can be utilized to determine the ion density of the electrodes. The method can be implemented on a processing device, and is particularly applicable to Li-ion batteries.

19 Claims, 8 Drawing Sheets

METHOD OF ESTIMATING SOLID PHASE POTENTIAL

BACKGROUND

1. Field of the Invention

The present teachings relate to a machine implemented method for estimating the solid phase potential of either positive or negative electrode of a battery. This machine implemented method includes estimating the solid phase potential by use of a multi-layer model of the electrode to derive the solid phase potentials, and utilizing voltage and current readings to update diffusion coefficients used by the multi-layer model to obtain a more accurate estimation of the solid phase potential. The method can be implemented on a processing device to control battery charging conditions over a charging regime to optimize the battery charging process.

2. Discussion of the Related Art

One known battery management system that determines the state of charge of the battery by receiving signals representative of physical quantities of the battery is set forth in U.S. Pat. No. 6,016,047. Another known method for determining various variables, including electrolyte concentration, of a battery subdivides the battery volume into at least two electrolyte volume components, and is set forth in U.S. Pat. No. 7,327,147.

One model used to estimate a battery's internal states is the Single Particle Battery model. This model is presented in detail in, at least, two technical papers, "Cycle Life Modeling of Lithium-Ion Batteries," G. Ning, B. N. Popov, Journal of Electrochemical Society 151 (2004), pages A1584-A1591, and "Online estimation of the state of charge of a lithium ion cell," S. Santhanagopalan, R. E. White, Journal of Power Sources 161 (2006), pages 1346-1355, both of which are incorporated herein in their entireties.

A need exists for a method that accurately determines the solid phase potential of both of the positive and negative electrodes of a battery which information can be utilized to control a battery charging system, which can in turn, lead to an improved energy storage device, particularly for automotive applications.

SUMMARY

The present teachings are directed to a machine implemented method for estimating the solid phase potentials of the electrodes of a battery. This method can include the steps of providing battery voltage information and an estimated solid phase potential to a model coefficient updater, and updating a model coefficient by utilizing the battery voltage information and estimated solid phase potential. The presently disclosed method further includes providing the updated model coefficient and battery current information to a battery internal variable estimator which then estimates the solid phase potentials. This method can be implemented on a processing device.

Also taught by the present disclosure is a battery charging device for a battery including a battery, a battery charger for charging the battery, and a charging control system including a machine implemented method for determining the solid phase potential of either positive or negative electrode of the battery. This machine implemented method, which can be contained on a processor, further includes providing battery voltage information and an estimated solid phase potential to a model coefficient updater which updates a model coefficient by utilizing the battery voltage information and estimated solid phase potential. The updated model coefficient can be provided, along with battery current information to a battery internal variable estimator which can then estimate the solid phase potentials.

Additionally disclosed by this present disclosure is a battery charging device including a processing device comprising a model coefficient updater and a battery internal variable estimator, a battery voltage sensor providing battery voltage information, and a battery current sensor providing battery current information. This battery charging device can further include a system for determining the solid phase potentials of the electrodes of the battery by providing battery voltage information and an estimated solid phase potential to the model coefficient updater, updating a model coefficient by utilizing the battery voltage information and estimated solid phase potential, providing battery current information to the battery internal variable estimator, providing the updated model coefficient to the battery internal variable estimator, and then estimating the solid phase potentials by utilizing the updated model coefficient and the battery current information. This system and method can be implemented on the processing device.

BRIEF DESCRIPTION OF THE DRAWINGS

The accompanying drawings, which are included to provide a further understanding of the invention and are incorporated in and constitute a part of this specification, illustrate preferred embodiments of the invention and together with the detailed description serve to explain the principles of the invention. In the drawings.

DETAILED DESCRIPTION

Figure 1:
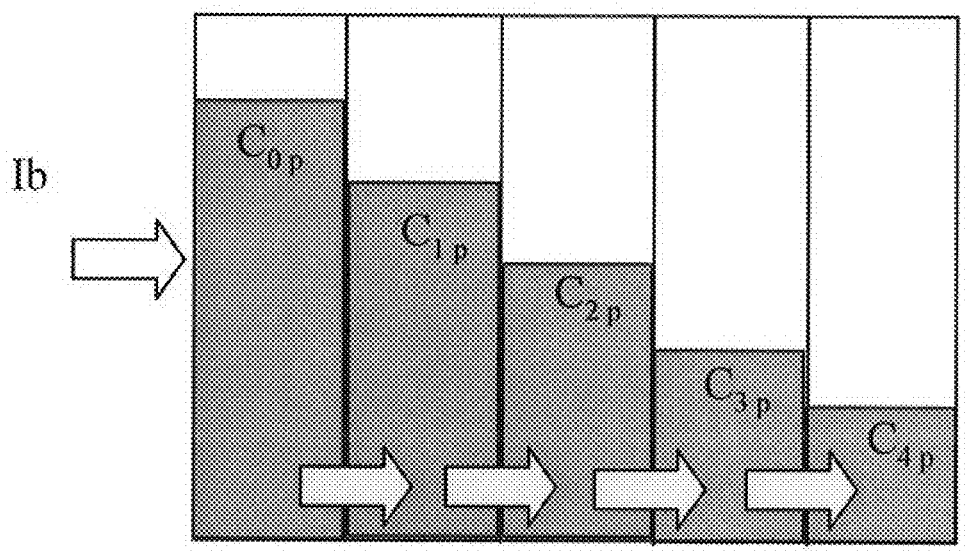
FIG. 1 is a graphical representation of an electrode divided into multiple layers for an N=5 case.

The present disclosure teaches a machine implemented method for estimating the solid phase potentials of the electrodes of a battery. This method can include the steps of providing battery voltage information and an estimated solid phase potential to a model coefficient updater, and updating a model coefficient by utilizing the battery voltage information and estimated solid phase potential. The presently disclosed method further includes providing the updated model coefficient and battery current information to a battery internal variable estimator which then estimates the solid phase potentials. This method can be implemented on a processing device.

The model coefficient can be, for example, a coefficient of ion diffusion within the electrodes of the battery, for instance, diffusion of Li ions within a lithium ion battery. This ionic behavior can be modeled by a multi-layer model of the ionic behavior of the electrodes, and this model can be utilized by the battery internal variable estimator of the presently disclosed method.

The model coefficient updater can update the model coefficient for the multi-layer model for each electrode through the steps of a) acquiring a battery voltage value from a battery voltage sensor;

b) determining a reference solid phase potential value and estimated solid phase potential for each electrode from the relationship: battery voltage is equal to solid phase potential at the positive electrode minus solid phase potential at the negative electrode;

c) determining the change increment for the reference solid phase potential;

d) determining the change increment for the estimated solid phase potential;

e) comparing the absolute value of the battery current to a predetermined value, and if the absolute value of the battery current is greater than the predetermined value then;

f) comparing the absolute value of change increment for the reference solid phase potential to the absolute value of the change increment for the estimated solid phase potential;

g) updating the model coefficient, and then repeating steps a) through g) until either the absolute value of the change increment for the reference solid phase potential is equal to the absolute value of the change increment for the estimated solid phase potential, or the absolute value of the battery current is less than the predetermined value.

The above-stated relationship of battery voltage equal to solid phase potential at the positive electrode minus solid phase potential at the negative electrode, can be manipulated to obtained the desired values, such as, the reference solid phase potential at the positive electrode is equal to the battery voltage plus the estimated solid phase potential at the negative electrode. In the same manner, the reference solid phase potential at the negative electrode is equal to the estimated solid phase potential at the positive electrode minus the battery voltage.

In the present method, with each reference potential value reflecting actual battery conditions, then the model coefficients can be updated through the comparison of the reference solid phase potential to the estimated solid phase potential so that the estimated solid phase potential will eventually converge to the reference solid phase potential.

Figure 7:
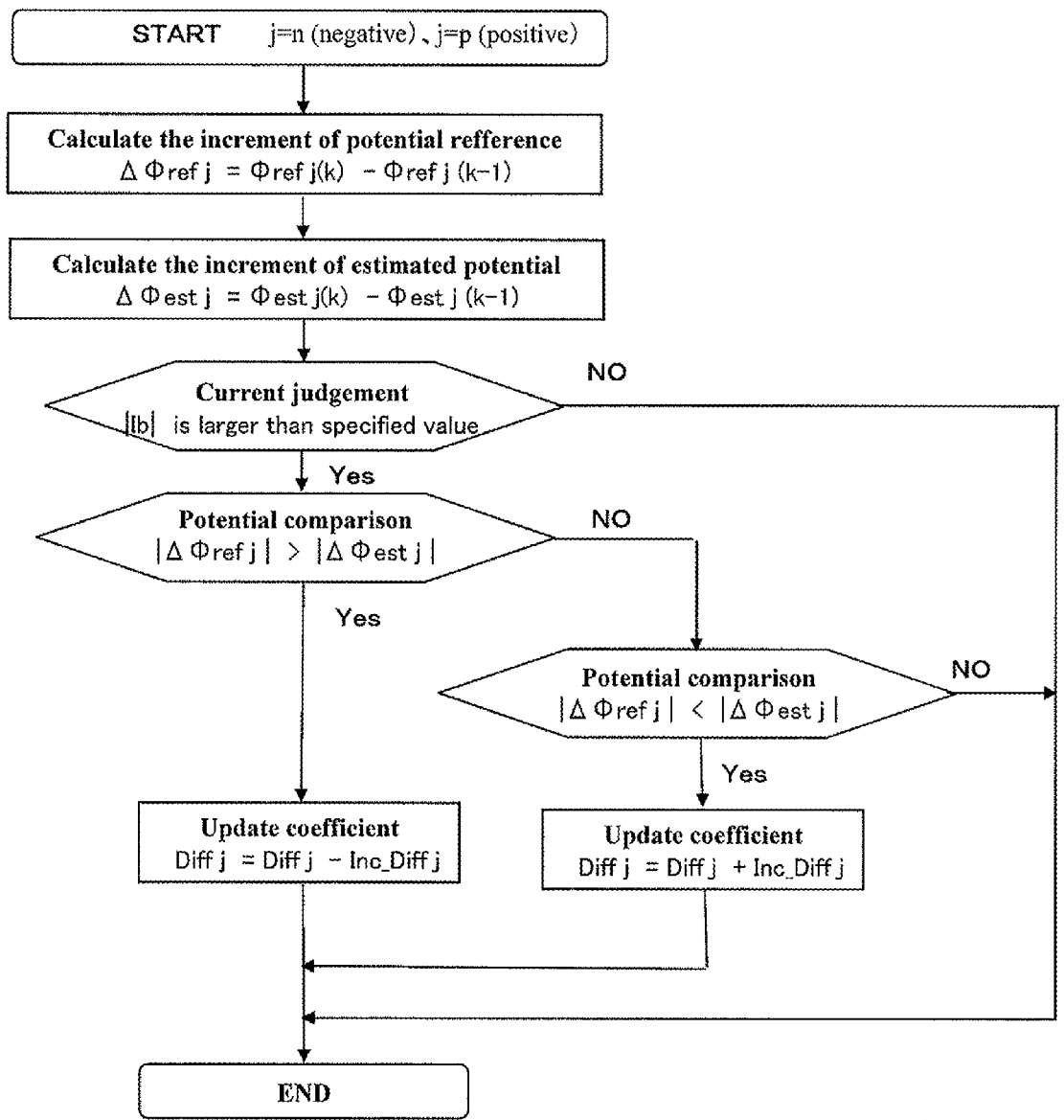
FIG. 7 is a flow diagram of the potential comparison.

As illustrated in FIG. 7, when the absolute value of the change increment for the reference solid phase potential is greater than the absolute value of the change increment for the estimated solid phase potential, then the updated model coefficient comprises the initial model coefficient minus an incremental value. And in the same manner, when the absolute value of the change increment for the reference solid phase potential is less than the absolute value of the change increment for the estimated solid phase potential, then the updated model coefficient comprises the initial model coefficient plus an incremental value.

The model coefficient, as utilized in some embodiments of the presently disclosed method, can be a coefficient of ion diffusion within the electrodes of the battery.

Figure 4:
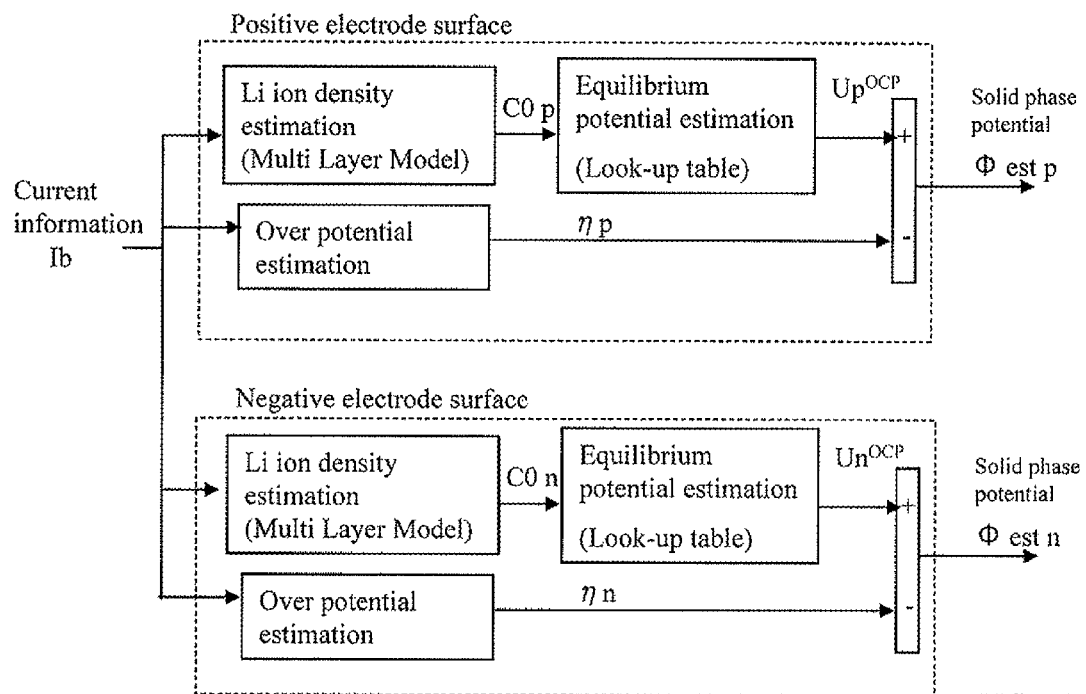
FIG. 4 is a schematic of the presently disclosed battery internal variable estimator.

As further illustrated in FIG. 4, this model coefficient can then be input for the ion density estimator portion of the battery internal variable estimator to thereby provide an estimate of the solid phase potentials of the electrodes. Specifically, the ion density can be modeled by a multi-layer model to determine ion densities at the $0^{th}$ layer of the electrode of interest, and in turn, the ion density can be used to determine the equilibrium potential ($U_j^{OCP}$) from look-up tables. Likewise, the battery internal variable estimator can determine the overpotential, which is a function of current, from the battery current value, and then subtract the overpotential from the equilibrium potential to obtain the estimated solid phase potential.

One of ordinary skill in the present art will know how to develop the look-up tables which are used to calculate the estimated equilibrium potentials for the respective electrodes from the ion density values provided by the multi-layer model. Examples of measuring the open circuit potential using reference electrodes to obtain the equilibrium potential of positive and negative electrodes of Li-ion batteries is provided in, for example, SAE-09PFL-0573, "Modeling of Li-ion Battery Performance in Hybrid Electric Vehicles" by W. F. Fang et al. (2009).

The multi-layer model implemented in the presently disclosed method can include the steps of dividing each electrode into N layers of active electrode material, determining a battery current applied to the electrode of the battery, determining the ion density variable for each one of the N layers of the active electrode material, and determining the ion density of the electrode surface. The ion density variable of each of the N layers of the active electrode material is a function of the difference between the respective ion density variables of adjacent N layers, while the ion density of the electrode surface is a function of the battery current and the difference between the respective ion density variables of adjacent N layers. One embodiment of this model is illustrated in FIG. 1 of the present disclosure.

The N variable of the present method can be two or more, and can be as large a number as suitable for use of the present method. N can be selected by one of skill in the art so as to provide a balance between accuracy of the presently disclosed method and the ease of solution.

In the presently disclosed machine implemented method, the ion density of the electrode surface can be equal to the ion density variable of the $0^{th}$ layer of active electrode material. More specifically, the ion density of the $0^{th}$ layer of active electrode material comprises the solution to the following equation:

$$C_{0j}(k+1) = C_{0j}(k) - D_{diffj}(C_{0j}(k) - C_{1j}(k)) + \frac{NT_c}{3600}I_b(k).$$

In the equations presented herein, j=n for the negative electrode, and j=p for the positive electrode.

In the machine implemented method according to the present disclosure, the ion density variable for each of the $1^{st}$ through the N$-2^{th}$ layer of active electrode material comprises the respective solutions to the following equation:

$$C_{ij}(k+1) = C_{ij}(k) + D_{diffj}(C_{i-1j}(k)) - D_{diffj}(C_{ij}(k) - C_{i+1j}(k))$$

for i equal to 1 to N−2.

Also for the presently disclosed machine implemented method, the ion density variable of the N−$1^{th}$ layer of active electrode material comprises the solution to the following equation:

$$C_{N-1j}(k+1) = C_{N-1j}(k) + D_{diffj}(C_{N-2j}(k) - C_{N-1j}(k)).$$

The presently disclosed machine implemented method can be applied to nearly any kind of battery, and in some cases, the battery can be a lithium ion battery.

The presently disclosed method can include the assumption that either of the positive or negative electrode can consist of N layers of active electrode material, and that the diffusion speed of ions within the active electrode material can be proportional to the difference between ion densities at adjacent layers.

The present disclosure also teaches a battery charging device for a battery including a battery, a battery charger for charging the battery, and a charging control system including a machine implemented method for determining the solid phase potential of either positive or negative electrode of the battery. This machine implemented method, which can be contained on a processor, further includes providing battery voltage information and an estimated solid phase potential to a model coefficient updater which updates a model coefficient by utilizing the battery voltage information and estimated solid phase potential. The updated model coefficient can be provided, along with battery current information to a battery internal variable estimator which can then estimate the solid phase potentials.

In some embodiments of the present disclosure, the battery charger for charging the battery can be a generator, and in some cases, can be a generator for a hybrid electric automotive vehicle. Charging and controlling the charging of lithium ion batteries are just examples of possible application of the presently disclosed methods and devices.

Further disclosed by this present disclosure is a battery charging device including a processing device comprising a model coefficient updater and a battery internal variable estimator, a battery voltage sensor providing battery voltage information, and a battery current sensor providing battery current information. This battery charging device can further include a system for determining the solid phase potentials of the electrodes of the battery by providing battery voltage information and an estimated solid phase potential to the model coefficient updater, updating a model coefficient by utilizing the battery voltage information and estimated solid phase potential, providing battery current information to the battery internal variable estimator, providing the updated model coefficient to the battery internal variable estimator, and then estimating the solid phase potentials by utilizing the updated model coefficient and the battery current information. This system and method can be implemented on the processing device. Suitable processing devices will be known to one of ordinary skill in the art.

The processing device which can carry out the battery management system described herein can include a processor, a random access memory, a read only memory, an input device, an output device, and a bus, wherein the bus connects the processor to one of more of the random access memory, the read only memory, the input device, and the output device, and the processor comprises a central processing unit.

Hybrid electric vehicle refers to vehicles that can incorporate two different sources of drive train power, for instance, an electric motor, and additionally, an internal combustion engine, for example, a gasoline or diesel powered engine.

The presently utilized multi-layer model can utilize an electrode that is divided into N number of equivalent layers, with the first layer numbered 0. This multi-layer model can be solved via Equations (1) through (4) set forth below. The presently disclosed multi-layer model can assume that either of the positive or negative electrode are made up of N layers of active electrode material, and that the ionic diffusion speed within the active electrode material can be proportional to the difference between ion densities at adjacent layers.

$$C_{0j}(k+1) = C_{0j}(k) - D_{diffj}(C_{0j}(k) - C_{1j}(k)) + \frac{NT_c}{3600}I_b(k) \quad (1)$$

$$C_{ij}(k+1) = C_{ij}(k) + D_{diffj}\left(\frac{C_{i-1j}(k)-}{C_{ij}(k)}\right) - D_{diffj}\left(\frac{C_{ij}(k)-}{C_{i+1j}(k)}\right) \quad (2)$$

$$C_{N-1j}(k+1) = C_{N-1j}(k) + D_{diffj}(C_{N-2j}(k) - C_{N-1j}(k)) \quad (3)$$

$$C_{0j} = C_j^s \quad (4)$$

In the equations set forth herein, the following definitions apply:

$I_b$ Current to the battery in C rate $C_{ij}$ Normalized Li ion density of electrode active material at each layer, j=n (negative), j=p (positive), i=0 ... N $C_j^s$ Normalized Li ion density at the surface of the active material, j=n (negative), j=p (positive)

$D_{diffj}$ Diffusion coefficient, j=n (negative), j=p (positive), and $T_c$ Update interval (second).

Figure 2:
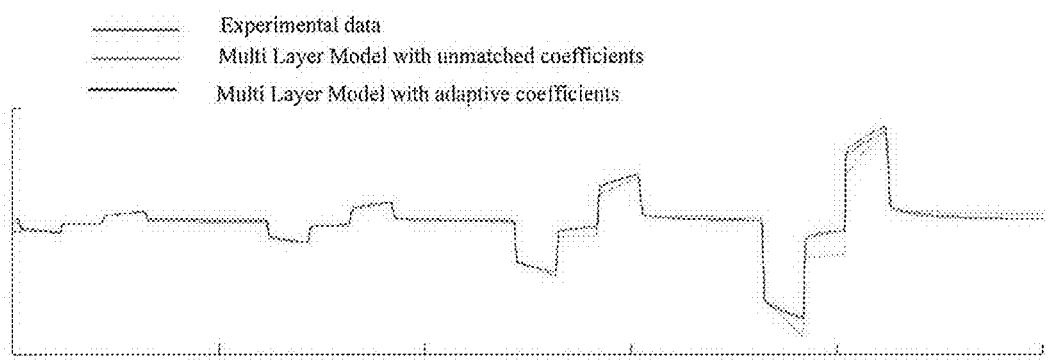
FIG. 2 is a graphical representation of the multi-layer model with unmatched and adaptive coefficients of diffusion versus experimental data for solid phase potential at the positive electrode.

A comparison against experimental data with estimated solid phase potentials from use of the presently disclosed multi-layer model using unmatched and adaptive coefficients is graphically presented in FIG. 2. Use of unmatched coefficients is illustrative of an aged battery where the model does not take into account the effects of aging, whereas the adaptive coefficients reflect the effects of aging on the behavior or properties of the battery as it ages. Such properties as diffusion characteristics and its effects on overall battery performance are examples. Here, the unmatched coefficients (green line) vary from the experimental results (red line), while the adaptive coefficients (blue line) provided by the methods and devices of the present disclosure more close matches the experimental results. With the presently disclosed method, it is possible to match the experimental results by updating the model coefficient on a real time basis and obtaining suitable results regardless of the variation in battery behavior due to aging or other conditions.

Figure 5:
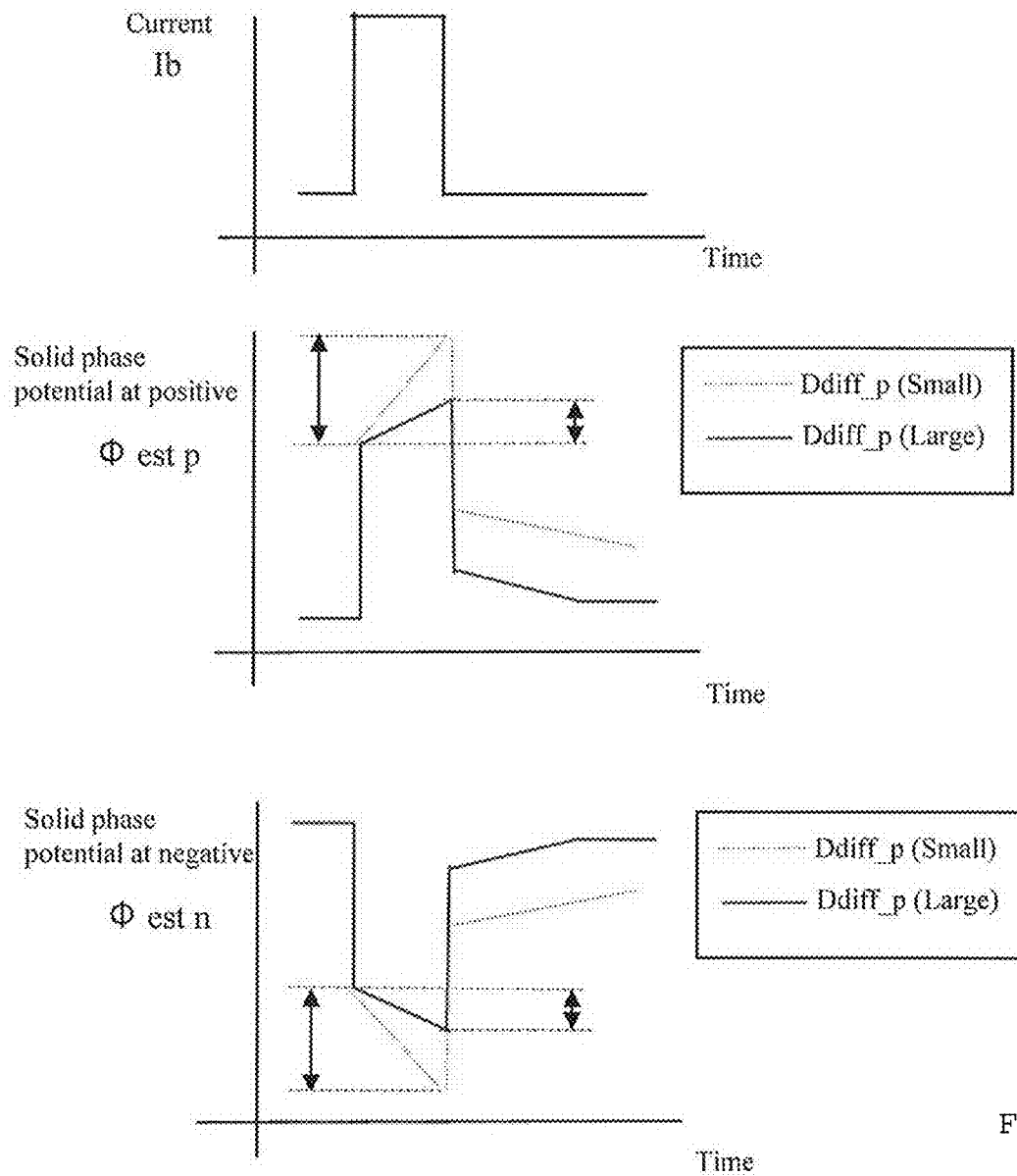
FIG. 5 is a graphical representation of the effect of diffusion coefficient on estimated solid phase potential.

As set forth in FIG. 5, the model coefficient, $D_{diff}$, impacts the transient behavior of the estimated solid phase potential obtained by the presently disclosed method. Shown here, a smaller $D_{diff}$ results in faster transient behavior for the estimated solid phase potential.

Figure 3:
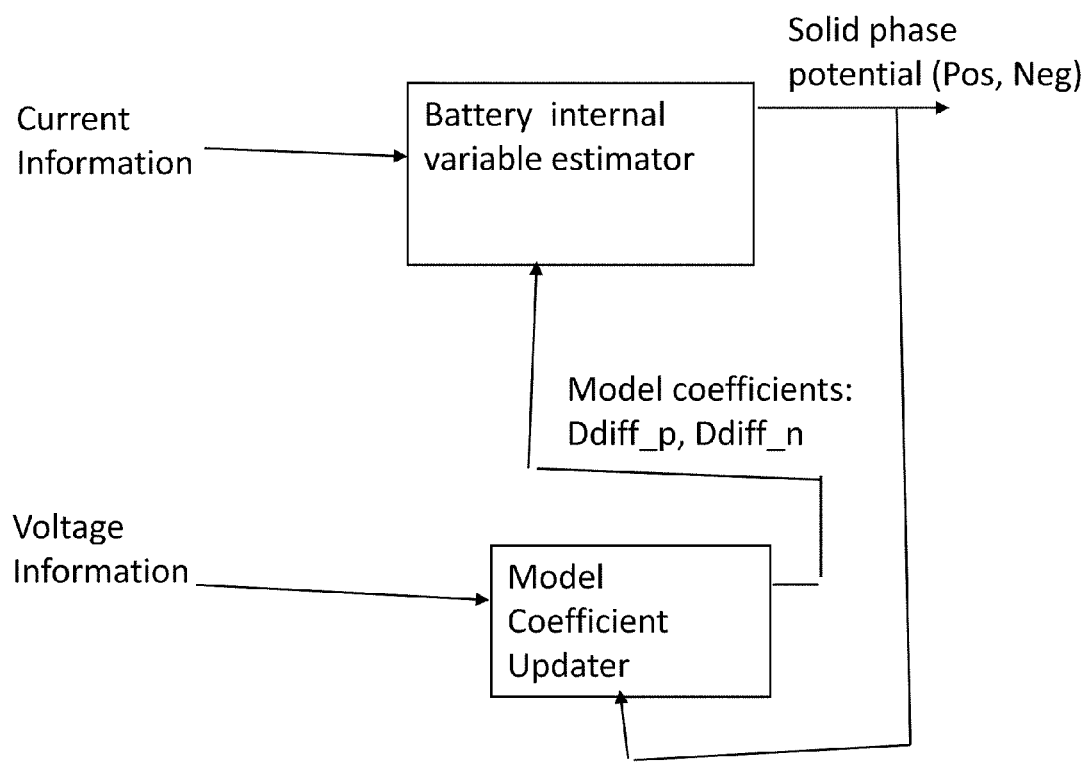
FIG. 3 is a schematic of the presently disclosed method.
Figure 6:
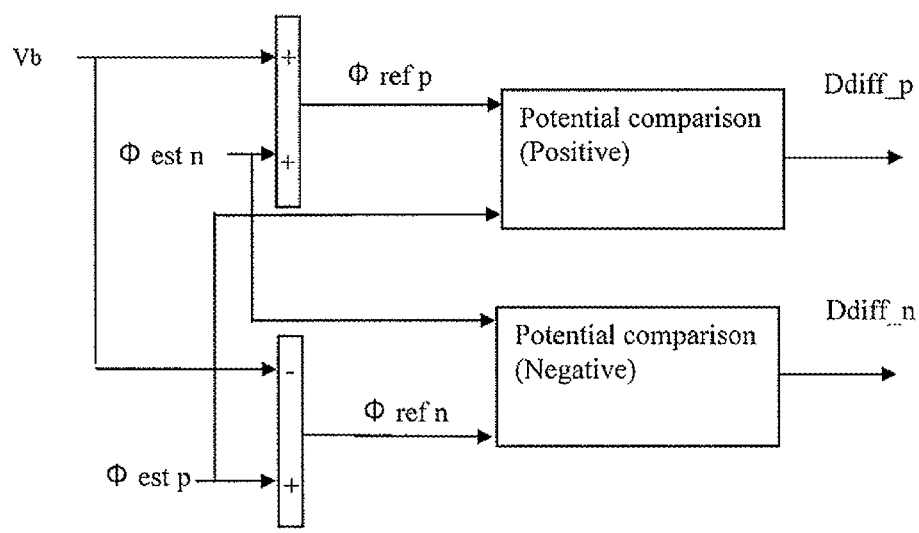
FIG. 6 is a schematic of the presently disclosed model coefficient updater.

A general schematic overview of one embodiment of the present method is presented in FIG. 3 with FIG. 4 showing the operation of one embodiment of the battery internal variable estimator, FIG. 6 showing the operation of one embodiment of model coefficient updater, and then FIG. 7 showing the decision path of one embodiment of the potential comparison section of the model coefficient updater.

Figure 8:
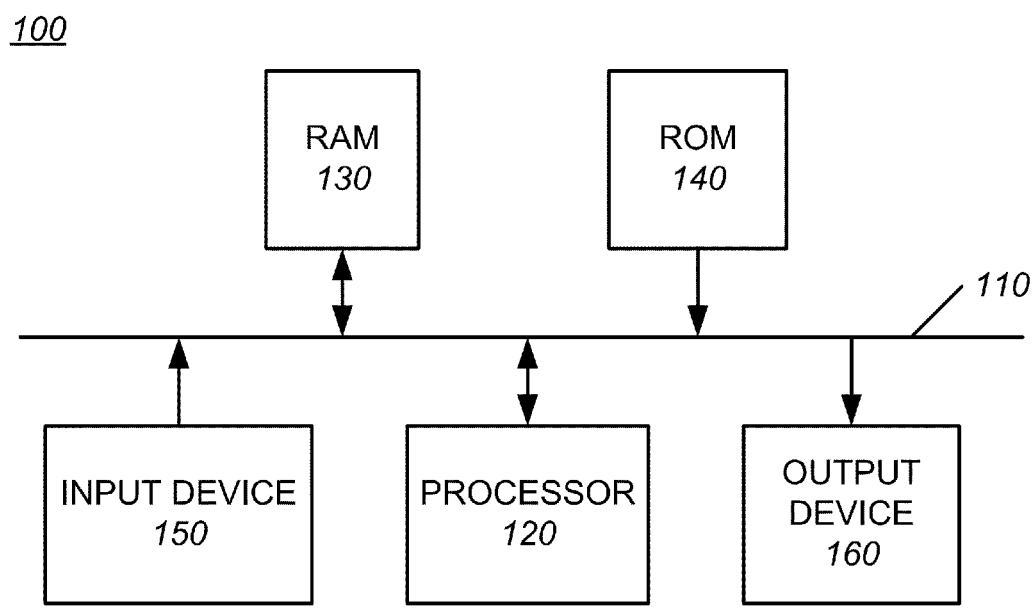
FIG. 8 is a schematic of a processing device.

FIG. 8 illustrates an exemplary processing device 100, which may be used to implement embodiments consistent with the presently disclosed subject matter. Processing device 100 may be a battery control device, a subsystem of a battery charging system, an engine control module on an automotive vehicle, a personal computer ("PC"), a handheld processing device, or another type of processing device. Processing device 100 may include a bus 110, a processor 120, a random access memory ("RAM") 130, a read only memory ("ROM") 140, an input device 150, and an output device 160. Bus 110 may connect processor 120 to RAM 130, ROM 140 and output device 160.

Processor 120 may include one or more conventional processors that interpret and execute instructions, including, but not limited to a central processing unit ("CPU"). A memory may include RAM 130, ROM 140, and/or another type of dynamic or static storage device that stores information and instructions for execution by processor 120. RAM 130, or another type of dynamic storage device, may store instructions as well as temporary variables or other intermediate information used during execution of instructions by processor 120. ROM 140, or another type of static storage device, may store static information and instructions for processor 120.

Input device 150 may include a data input source such as input from a battery condition sensor, such as, a battery voltage sensor, or a battery current sensor, or other device for providing input. Output device 160 may include a data output for data to be inputted into another step of the presently disclosed method, or other device for outputting information.

Processing device 100 may perform functions in response to processor 120 executing sequences of instructions contained in a tangible machine-readable medium, such as, for example, RAM 130, ROM 140 or other medium. Such instructions may be read into RAM 130 from another tangible machine-readable medium or from a separate device via a communication interface (not shown). Analog to digital, and digital to analog converters can also be present in the processing device as needed.

As used herein, "adjacent" refers to articles or layers having a common boundary or edge, that is, touching.

The present application is related to co-pending U.S. patent application Ser. Nos. 12/129,416 and 12/236,103, filed May 29, 2008, and Sep. 22, 2008, respectively, and hereby incorporates said applications herein in their entireties.

All publications, articles, papers, patents, patent publications, and other references cited herein are hereby incorporated herein in their entireties for all purposes.

Although the foregoing description is directed to the preferred embodiments of the present teachings, it is noted that other variations and modifications will be apparent to those skilled in the art, and which may be made without departing from the spirit or scope of the present teachings.

The foregoing detailed description of the various embodiments of the present teachings has been provided for the purposes of illustration and description. It is not intended to be exhaustive or to limit the present teachings to the precise embodiments disclosed. Many modifications and variations will be apparent to practitioners skilled in this art. The embodiments were chosen and described in order to best explain the principles of the present teachings and their practical application, thereby enabling others skilled in the art to understand the present teachings for various embodiments and with various modifications as are suited to the particular use contemplated. It is intended that the scope of the present teachings be defined by the following claims and their equivalents.

What I claim is:

1. A machine implemented method for estimating the solid phase potentials of the electrodes of a battery, the machine implemented method comprising:
   providing battery voltage information and an estimated solid phase potential to a model coefficient updater;
   updating a model coefficient by utilizing the battery voltage information and estimated solid phase potential;
   providing battery current information to a battery internal variable estimator;
   providing the updated model coefficient to the battery internal variable estimator; and
   estimating the solid phase potentials by utilizing the updated model coefficient and the battery current information,
   wherein the method is implemented on a processing device.

2. The method according to claim 1, wherein the model coefficient comprises a coefficient of ion diffusion within the electrodes of the battery.

3. The method according to claim 1, wherein the battery internal variable estimator comprises a multi-layer model of the ionic behavior of the electrodes.

4. The method according to claim 1,
   wherein the model coefficient updater updates a model coefficient for a multi-layer model for each electrode by
   a) acquiring a battery voltage value from a battery voltage sensor;
   b) determining a reference solid phase potential value and estimated solid phase potential for each electrode from the relationship: battery voltage is equal to solid phase potential at the positive electrode minus solid phase potential at the negative electrode;
   c) determining the change increment for the reference solid phase potential;
   d) determining the change increment for the estimated solid phase potential;
   e) comparing the absolute value of the battery current to a predetermined value, and if the absolute value of the battery current is greater than the predetermined value then;
   f) comparing the absolute value of change increment for the reference solid phase potential to the absolute value of the change increment for the estimated solid phase potential;
   g) updating the model coefficient, and
   repeating steps a) through g) until either the absolute value of the change increment for the reference solid phase potential is equal to the absolute value of the change increment for the estimated solid phase potential, or the absolute value of the battery current is less than the predetermined value.

5. The method according to claim 4,
   wherein when the absolute value of the change increment for the reference solid phase potential is greater than the absolute value of the change increment for the estimated solid phase potential, then
   the updated model coefficient comprises the initial model coefficient minus an incremental value.

6. The method according to claim 4,
   wherein when the absolute value of the change increment for the reference solid phase potential is less than the absolute value of the change increment for the estimated solid phase potential, then
   the updated model coefficient comprises the initial model coefficient plus an incremental value.

7. The method according to claim 4, wherein the model coefficient comprises a coefficient of ion diffusion within the electrodes of the battery.

8. The method according to claim 1,
   wherein the battery internal variable estimator estimates the solid phase potentials of the electrodes by:
   using a multi-layer model to determine ion densities at the $0^{th}$ layer of the electrode of interest;
   using the ion density to determine the equilibrium potential ($U_j^{OCP}$) from look-up tables;
   determining the overpotential from the battery current value, and
   subtracting the overpotential from the equilibrium potential to obtain the estimated solid phase potential.

9. The method according to claim 8, wherein the multi-layer model comprises
   dividing each electrode into N layers of active electrode material;
   determining a battery current applied to the electrode of the battery;
   determining the ion density variable for each one of the N layers of the active electrode material; and
   determining the ion density of the electrode surface, and
   wherein the ion density variable of each of the N layers of the active electrode material comprises a function of the difference between the respective ion density variables of adjacent N layers, and
   wherein the ion density of the electrode surface comprises a function of the battery current and the difference between the respective ion density variables of adjacent N layers.

10. The method according to claim 9, wherein the ion density of the electrode surface comprises the ion density variable of the $0^{th}$ layer of active electrode material.

11. The method according to claim 9, wherein the ion density of the $0^{th}$ layer of active electrode material comprises the solution to the following equation:

$$C_{0j}(k+1) = C_{0j}(k) - D_{diffj}(C_{0j}(k) - C_{1j}(k)) + \frac{NT_c}{3600}I_b(k).$$

12. The method according to claim 9, wherein the ion density variable for each of the $1^{st}$ through the $N-2^{th}$ layer of active electrode material comprises the respective solutions to the following equation:

$$C_{ij}(k+1) = C_{ij}(k) + D_{diffj}(C_{i-1j}(k) - C_{ij}(k)) - D_{diffj}(C_{ij}(k) - C_{i+1j}(k))$$

for i equal to 1 to N−2.

13. The method according to claim 9, wherein the ion density variable of the $N-1^{th}$ layer of active electrode material comprises the solution to the following equation:

$$C_{N-1j}(k+1) = C_{N-1j}(k) + D_{diffj}(C_{N-2j}(k) - C_{N-1j}(k)).$$

14. The method according to claim 1, wherein the battery comprises a lithium ion battery.

15. A battery charging device for a battery comprising:
a battery;
a battery charger for charging the battery; and
a charging control system comprising a machine implemented method for determining the solid phase potential of either positive or negative electrode of the battery, the machine implemented method comprising:
providing battery voltage information and an estimated solid phase potential to a model coefficient updater;
updating a model coefficient by utilizing the battery voltage information and estimated solid phase potential;
providing battery current information to a battery internal variable estimator;
providing the updated model coefficient to the battery internal variable estimator; and
estimating the solid phase potentials by utilizing the updated model coefficient and the battery current information,
wherein the method is implemented on a processing device.

16. A battery charging device for a battery according to claim 15, wherein the battery charger for charging the battery comprises a generator.

17. A battery charging device for a battery according to claim 15, wherein the battery charger for charging the battery comprises a generator for a hybrid electric vehicle.

18. A battery charging device for a battery according to claim 15, wherein the battery comprises a lithium ion battery.

19. A battery charging device comprising:
a processing device comprising a model coefficient updater and a battery internal variable estimator,
a battery voltage sensor providing battery voltage information;
a battery current sensor providing battery current information, and
wherein the solid phase potentials of the electrodes of the battery are determined by a method comprising:
providing battery voltage information and an estimated solid phase potential to the model coefficient updater of the processor;
updating a model coefficient by utilizing the battery voltage information and estimated solid phase potential;
providing battery current information to the battery internal variable estimator of the processor;
providing the updated model coefficient to the battery internal variable estimator of the processor; and
estimating the solid phase potentials by utilizing the updated model coefficient and the battery current information,
wherein the method is implemented on the processing device.

* * * * *